US009490363B2

(12) United States Patent
Huang et al.

(10) Patent No.: US 9,490,363 B2
(45) Date of Patent: Nov. 8, 2016

(54) TUNNELING FIELD EFFECT TRANSISTOR HAVING A THREE-SIDE SOURCE AND FABRICATION METHOD THEREOF

(71) Applicant: PEKING UNIVERSITY, Beijing (CN)

(72) Inventors: Ru Huang, Beijing (CN); Qianqian Huang, Beijing (CN); Chunlei Wu, Beijing (CN); Jiaxin Wang, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/782,284

(22) PCT Filed: Mar. 31, 2014

(86) PCT No.: PCT/CN2014/074368
§ 371 (c)(1),
(2) Date: Oct. 2, 2015

(87) PCT Pub. No.: WO2015/070555
PCT Pub. Date: May 21, 2015

(65) Prior Publication Data
US 2016/0043220 A1    Feb. 11, 2016

(30) Foreign Application Priority Data

Nov. 18, 2013  (CN) .......................... 2013 1 0576433

(51) Int. Cl.
*H01L 29/78*  (2006.01)
*H01L 29/08*  (2006.01)
(Continued)

(52) U.S. Cl.
CPC ....... *H01L 29/7835* (2013.01); *H01L 21/0274* (2013.01); *H01L 21/02636* (2013.01);
(Continued)

(58) Field of Classification Search
CPC ........... H01L 29/0847; H01L 29/1033; H01L 29/66659; H01L 29/7835
See application file for complete search history.

(56) References Cited

U.S. PATENT DOCUMENTS 5,382,815 A     1/1995  Mohammad et al.
7,671,418 B2 *  3/2010  Topaloglu ........... H01L 29/7843
                                                     257/365
(Continued)

FOREIGN PATENT DOCUMENTS

CN    102005481 A    4/2011
CN    102157559 A    8/2011
(Continued)

OTHER PUBLICATIONS

International Search Report (ISA/CN) for International Application No. PCT/CN2014/074368, mailed Jul. 23, 2014, 2 pages.

*Primary Examiner* — Bac Au
(74) *Attorney, Agent, or Firm* — Foley & Lardner LLP; Antoinette F. Konski

(57) ABSTRACT

The present invention discloses a tunneling field effect transistor having a three-side source and a fabrication method thereof, referring to field effect transistor logic devices and circuits in CMOS ultra large scale integrated circuits (ULSI). By means of the strong depletion effect of the three-side source, the transistor can equivalently achieve a steep doping concentration gradient for the source junction, significantly optimizing the sub-threshold slope of the TFET. Meanwhile, the turn-on current of the transistor is boosted. Furthermore, due to a region uncovered by the gate between the gate and the drain, the bipolar conduction effect of the transistor is effectively inhibited, and on the other hand, in the small-size transistor a parasitic tunneling current at the corner of the source junction is inhibited. The fabrication method is simple and can be accurately controlled. By forming the channel region using an epitaxy method subsequent to etching, it facilitates to form a steeper doping concentration gradient for the source region or form a hetero-junction. Moreover, the fabrication flow of the post-gate process facilitates to integrate a high-k gate dielectric/a metal gate having good quality, further improving the performance of the transistor.

9 Claims, 4 Drawing Sheets

(51) Int. Cl.

| | | |
|---|---|---|
| *H01L 29/66* | (2006.01) | |
| *H01L 29/739* | (2006.01) | |
| *H01L 21/02* | (2006.01) | |
| *H01L 21/027* | (2006.01) | |
| *H01L 21/265* | (2006.01) | |
| *H01L 21/266* | (2006.01) | |
| *H01L 21/308* | (2006.01) | |
| *H01L 21/3213* | (2006.01) | |
| *H01L 21/324* | (2006.01) | |
| *H01L 29/06* | (2006.01) | |
| *H01L 29/10* | (2006.01) | |
| *H01L 29/267* | (2006.01) | |
| *H01L 29/165* | (2006.01) | |
| *H01L 29/205* | (2006.01) | |
| *H01L 29/225* | (2006.01) | |
| *H01L 21/28* | (2006.01) | |

(52) U.S. Cl.
CPC ....... *H01L21/266* (2013.01); *H01L 21/26513* (2013.01); *H01L 21/308* (2013.01); *H01L 21/324* (2013.01); *H01L 21/32139* (2013.01); *H01L 29/0653* (2013.01); *H01L 29/0692* (2013.01); *H01L 29/08* (2013.01); *H01L 29/0847* (2013.01); *H01L 29/1033* (2013.01); *H01L 29/66356* (2013.01); *H01L 29/66659* (2013.01); *H01L 29/66977* (2013.01); *H01L 29/7391* (2013.01); *H01L 21/28238* (2013.01); *H01L 29/165* (2013.01); *H01L 29/205* (2013.01); *H01L 29/225* (2013.01); *H01L 29/267* (2013.01)

(56) References Cited

U.S. PATENT DOCUMENTS

| | | | |
|---|---|---|---|
| 2005/0199940 A1* | 9/2005 | Mine | H01L 21/28282 257/315 |
| 2010/0117136 A1 | 5/2010 | Yasuda | |
| 2013/0264544 A1 | 10/2013 | Karg et al. | |
| 2015/0228768 A1* | 8/2015 | Zhao | H01L 29/66977 257/39 |
| 2016/0079400 A1* | 3/2016 | Huang | H01L 29/7391 257/105 |

FOREIGN PATENT DOCUMENTS

| | | |
|---|---|---|
| CN | 102148255 A | 10/2011 |
| CN | 102569405 A | 7/2012 |
| CN | 102983168 A | 3/2013 |
| CN | 103579324 A | 2/2014 |

\* cited by examiner

US 9,490,363 B2

TUNNELING FIELD EFFECT TRANSISTOR HAVING A THREE-SIDE SOURCE AND FABRICATION METHOD THEREOF

CROSS-REFERENCE TO RELATED APPLICATIONS

The present application is a U.S. national stage application under 35 U.S.C. 371 of International Application No. PCT/CN2014/074368, filed Mar. 31, 2014, which in turn claims priority of Chinese Patent Application No. 201310576433.7), filed Nov. 18, 2013, the content of each of which is incorporated herein by reference in its entirety.

TECHNICAL FIELD

The invention refers to field effect transistor logic devices and circuits in CMOS ultra large scale integrated circuits (ULSI), and particularly refers to a tunneling field effect transistor having a three-side source and a fabrication method thereof.

BACKGROUND OF THE INVENTION

Driven by the Moore's Law, a feature size of the conventional MOSFET continues to shrink and now enters into a nanometer scale. Consequently, negative effects such as short channel effect become more serious. Besides, effects such as drain induced barrier lowering and band-to-band tunneling cause an off-state leakage current to be continually increased. At the same time, a sub-threshold slope of the conventional MOSFET is not able to be decreased in synchronization with the shrink of the size of the MOSFET due to the limitation by the thermal potential, and thereby the power consumption increases. The concern of the power consumption now becomes the most serious problem limiting the scaling down of the MOSFET.

In order to be applied to the field of ultra-low voltage and ultra-low power consumption, a device having an ultra-steep sub-threshold slope, obtained by adopting a new turning-on mechanism and a fabrication method thereof have gained attentions in the context of small size devices. In recent years, researchers have proposed a possible solution, that is, a tunneling field effect transistor (TFET). Different from the conventional MOSFET, the TFET has source and drain regions doped with opposite types and achieves turning-on by controlling the band-to-band tunneling of the reverse-biased P-I-N junction through the gate, thereby breaking through the limitation of the sub-threshold slope 60 mV/dec of the conventional MOSFET while generating a very small leakage current. The TFET has several superior characteristics such as low leakage current, low sub-threshold slope, low operating voltage and low power consumption. However, due to the limitation of the tunneling probability and the tunneling area for the source junction, the TFET is faced with a problem of small on-state current, which is far less than that of the conventional MOSFET, and this greatly limits the application of the TFET. In addition, the TFET having a steep sub-threshold slope is difficult to be achieved in experiments. This is because it is difficult in experiments to achieve a steep doping concentration gradient at the source junction, so that the electric field at the tunneling junction is not sufficiently large when the TFET turns on, causing the sub-threshold slope of the TFET to be degraded relative to the theoretical value. Therefore, it has become another important issue of the TFET that how to achieve a steep doping concentration gradient at the source junction in order to obtain an ultra-low sub-threshold slope.

SUMMARY OF THE INVENTION

An object of the present invention is to provide a tunneling field effect transistor having a three-side source and a fabrication method thereof. By means of the strong depletion effect of the three-side source, the transistor can equivalently achieve a steep doping concentration gradient for the source junction, significantly optimizing the sub-threshold slope of the TFET. Meanwhile, the turn-on current of the transistor is boosted. Furthermore, due to a region uncovered by the gate between the gate and the drain, the bipolar conduction effect of the transistor is effectively inhibited, and on the other hand, in the small-size transistor a parasitic tunneling current at the corner of the source junction is inhibited. The fabrication method is simple and can be accurately controlled. By forming the channel region using an epitaxy method subsequent to etching, it facilitates to form a steeper doping concentration gradient for the source region or form a hetero-junction. Moreover, the fabrication flow of the post-gate process facilitates to integrate a high-k gate dielectric/a metal gate having good quality, further improving the performance of the transistor.

The technical solution of the present invention is provided as follows.

A tunneling field effect transistor according to the present invention is shown in FIG. 1, including a semiconductor substrate (1), a channel region (6), a highly-doped source region (3), a lightly-doped drain region (4), a gate dielectric layer (7), and a control gate (8), wherein the channel region (6) is in a cuboid shape; when viewing from a horizontal direction, a side of the channel region (6) extends into the highly-doped source region (3), and the other side thereof is connected to the lightly-doped drain region (4); when viewing from a vertical direction, the channel region (6) is located under the control gate (8) and the gate dielectric layer (7); the channel region (6) extending into the highly-doped source region (3) is surrounded at three sides by the highly-doped source region (3), while the channel region (6) not extending into the highly-doped source region (3) is surrounded by the semiconductor substrate (1); the control gate (8) is spaced apart from the lightly-doped drain region (4) by a horizontal interval; the control gate (8) covers the highly-doped source region (3) and a part of the channel region (6); the lightly-doped drain region (4) and the highly-doped source region (3) are doped with different types of impurities; the lightly-doped drain region (4) has a doping concentration between $5\times10^{17}$ cm$^{-3}$ and $1\times10^{19}$ cm$^{-3}$, and the highly-doped source region (3) has a doping concentration between $1\times10^{19}$ cm$^{-3}$ and $1\times10^{21}$ cm$^{-3}$. Both of the semiconductor substrate (1) and the channel region (6) have a doping concentration between $1\times10^{14}$ cm$^{-3}$ and $1\times10^{17}$ cm$^{-3}$. The cuboid shaped channel region (6) has equal width and height, which is less than twice width of a source depletion layer, the width of the source depletion layer having a range between 25 nm and 1.5 μm; the channel region (6) has a length greater than a width and a height, a ratio of the length to the width and height of the channel region (6) being between 1.5:1 and 5:1. The horizontal interval between the lightly-doped drain region (4) and the control gate (8) is between 10 nm and 1 μm.

A fabrication method of the tunneling field effect transistor described above comprises the steps of:

(1) defining an active region on a semiconductor substrate by a shallow trench isolation process;

(2) exposing a source doping region by photolithography, and forming a highly-doped source region by performing ion implantation using a photoresist as a mask;

(3) exposing a drain doping region by photolithography, forming a lightly-doped drain region having a different doping type by performing ion implantation using a photoresist as a mask, and then performing rapid high temperature thermal annealing to activate the doped impurities;

(4) depositing a hard mask material, and then performing photolithography and etching on the hard mask material to form a horizontal pattern exposing a location of the channel region, the pattern incorporating a part of the highly-doped region and a part of the semiconductor substrate;

(5) forming a cuboid region where the channel region is located by etching under protection of the hard mask material;

(6) performing selective epitaxy to epitaxially grow a lightly-doped channel region under protection of the hard mask material, and performing chemical mechanical planarization (CMP) using the hard mask material as a stop layer;

(7) etching a certain thickness of the epitaxial material under protection of the hard mask material, the thickness being consistent with a thickness of the hard mask material; removing the hard mask material by using etching; and reducing surface roughness using sacrificial oxidation or hydrogen annealing;

(8) growing a gate dielectric layer and depositing a control gate material; performing photolithography and etching to form a control gate pattern, the control gate being spaced apart from the lightly-doped drain region by a certain interval;

(9) proceeding to conventional CMOS back-end processes, including depositing a passivation layer, opening a contact hole, and performing metallization, to fabricate the tunneling field effect transistor.

In the fabrication method described above, the material of the semiconductor substrate in the step (1) is selected from Si, Ge, SiGe, GaAs, or the other binary or ternary compound semiconductor in II-VI, III-V and IV-IV groups, silicon on insulator (SOI) and germanium on insulator (GOI).

In the fabrication method described above, material of the epitaxially grown channel region in the step (6) is selected from Si, Ge, SiGe, GaAs or other binary or ternary compound semiconductor of Groups II-VI, III-V and IV-IV.

In the fabrication method described above, the epitaxial growing method in the step (6) is selected from homo-epitaxy and hetero-epitaxy.

In the fabrication method described above, material of the gate dielectric layer in the step (8) is selected from $SiO_2$, $Si_3N_4$, and high-K gate dielectric In the fabrication method described above, a process for growing the gate dielectric layer in the step (8) is selected from one of the processes consisting of: common thermal oxidation, nitrogen-doped thermal oxidation, chemical vapor deposition and physical vapor deposition.

In the fabrication method described above, the control gate material in the step (9) is selected from doped polysilicon, metal cobalt, nickel and other metal or metal silicide.

The present invention has the technical effects as follows.

I. The PN junction provided by the three-side highly-doped source region of tunneling field effect transistor according to the present invention can effectively deplete the channel region, as shown in FIG. 1b, so that the energy band of the channel region below the gate is raised. Therefore, a steeper energy band and a narrower tunneling barrier width than the conventional TFET may be obtained when the band-to-band tunneling occurs, which equivalently achieves a steep doping concentration gradient for the tunneling junction and thereby significantly improves the sub-threshold characteristics of the conventional TFET. Meanwhile, compared with the junction depleted type tunneling field effect transistor having a planar strip gate in which the planar structure only relies on the PN junction depletion on both sides, the three-side surrounding structure according to the present invention can further effectively modulate the tunneling junction to obtain a steeper sub-threshold characteristic.

II. The present invention adopts a short-gate design, in which the control gate partially covers the channel region so that there is an uncovered region with a certain interval between the gate and the drain. Such a design not only effectively inhibits the tunneling at the drain junction, that is, the bipolar conduction effect in the conventional TFET, but also effectively lowers influences of the gate electrode on the uncovered region, thereby inhibiting the tunneling of the parasitic tunneling junction in the small-size transistor. A region that the tunneling of the parasitic tunneling junction occurs is shown in point C of FIG. 1c. Therefore, the present invention can lower the sub-threshold slope at the time the device is turned on. Moreover, the lower doping concentration in the drain region can further inhibit the bipolar conduction effect.

III. The fabrication process of the transistor is simple and controllable. The profile of the channel region can be precisely controlled by performing an epitaxy growing method subsequent to etching. Compared with the conventional tunneling transistor in which the actual channel length is less than the channel length defined by the gate length due to the diffusion of the source and drain, the transistor defines the channel length and width by using an etching method, facilitating the control of the profile of the fabricated channel region. Furthermore, in the present fabrication flow, since the annealing process for activating the source and drain is performed before the channel length and width are defined, the diffusion of the source and drain would not have influence on the channel.

IV. In the fabrication method, the method of epitaxially growing the channel region can facilitate the achieving of the very steep doping concentration gradient at the source junction, and, on the other hand can conveniently achieve the hetero-junction design in the tunneling field transistor, if using a hetero-epitaxy method. Both of the design of having the steep doping concentration gradient and the hetero-junction may fabricate to obtain the tunneling field effect transistor having a steeper band-to-band tunneling junction and a smaller tunneling barrier width, therefore a higher turn-on current and a lower sub-threshold slope may be achieved.

V. In the fabrication method of the transistor, by using the method that forming the source and drain region and performing the high temperature annealing to activate at first, and then forming the control gate, it may facilitate to integrate the high-k gate dielectric/the metal gate having good quality, preventing the high-k gate dielectric/the metal gate from degrading during the high temperature annealing to activate in the pre-gate process. Moreover, the tunneling field effect transistor of the high-k gate dielectric/the metal gate may further improve the performance of the transistor by obtaining more effective gate control capacity and stronger scaling-down capacity. In addition, the control gate according to the present invention does not need to align with the edge of the source region or the drain region, therefore the post-gate process in the present fabrication method is easier than that of the conventional MOSFET, and the process requirements are broadened.

In short, the structure of the transistor effectively modulates the source tunneling junction by using the design that the channel region is surrounded at three-sides by the highly-doped source region, and inhibits the bipolar conduction effect and the tunneling of the parasitic tunneling junction in the small-size transistor. Furthermore, the fabrication method of the transistor is simple and controllable. Using the method of etching and of epitaxially growing the channel region facilitates to accurately control the channel region, and to achieve a very steep tunneling junction, thereby further improving the sub-threshold and on-state characteristic of the transistor. Moreover, using the easier post-gate process may facilitate to integrate the high-k gate dielectric/the metal gate having good quality, thus improving the performance of the transistor. Compared with the existing TFET, the TFET using the present fabrication method may obtain a higher turn-on current and a steeper sub-threshold slope while maintaining a low leakage current, which can be expected to be adopted in the field of the low power consumption, thereby having a high practical value.

BRIEF DESCRIPTION OF THE DRAWINGS

FIG. 1a is a schematic view of a tunneling field effect transistor having a three-side source according to the present invention; FIG. 1b is a cross-section view taken along AA' direction of FIG. 1a; FIG. 1c is a cross-section view taken along BB' direction of FIG. 1a.

FIG. 5a is a schematic view of forming a cuboid where the channel region is located by etching under the protection of the hard mask layer; FIG. 5b is a cross-section view taken along AA' direction of FIG. 5a.

FIG. 7a is a schematic view of etching a certain thickness of the epitaxial material and removing the hard mask layer; FIG. 7b is a cross-section view of taken along AA' direction of FIG. 7a.

In the drawings:

| 1—semiconductor substrate | 2—photoresist |
| 3—highly-doped source region | 4—lightly-doped drain region |
| 5—hard mask layer | 6—channel region |
| 7—gate dielectric layer | 8—control gate |

DETAILED DESCRIPTION OF THE EMBODIMENTS

Hereinafter, the present invention will be further illustrated by examples. It is noted that, the disclosed embodiments are intended to help further understand the present invention, but it will be appreciated to those skilled in the art that various substitutes and modifications may be made without departing from the spirit and scope defined by the present invention and the following claims. Accordingly, the present invention should not be limited to the contents disclosed by the embodiments, and the protected scope of the present invention should be defined by the claims.

A specific example of the fabrication method according to the present invention includes the process steps as shown in FIG. 2 to FIG. 9.

Figure 1:
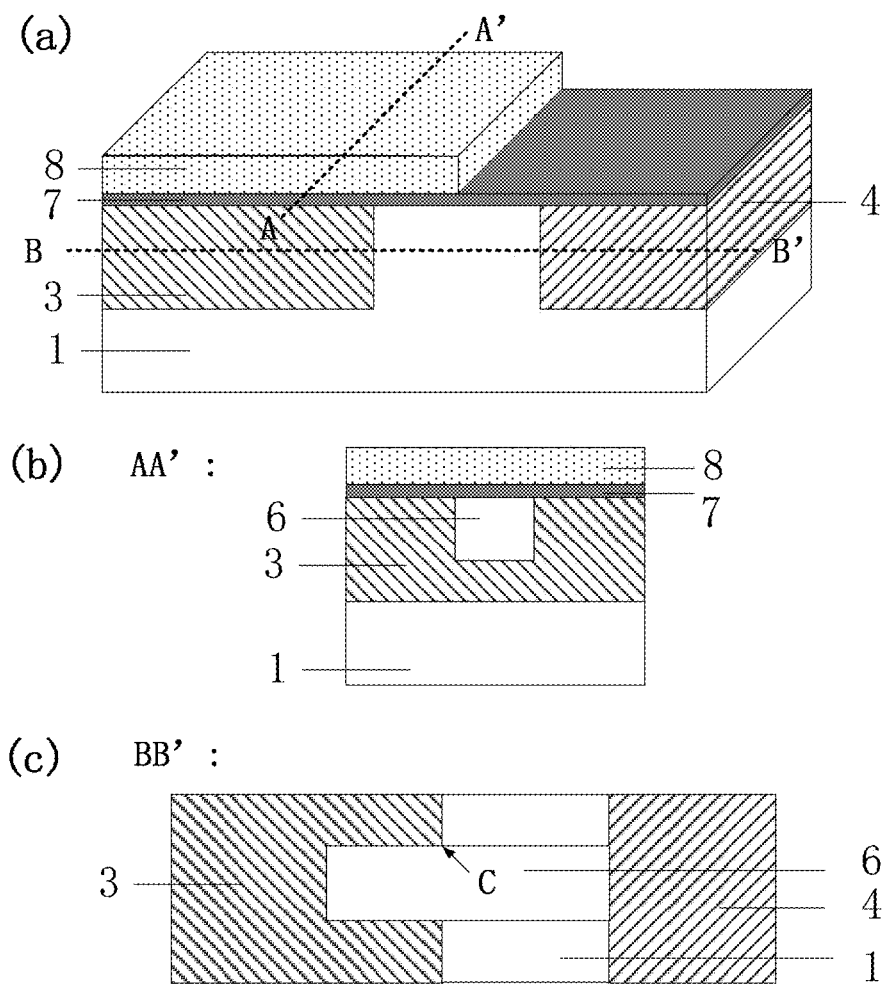
Figure 2:
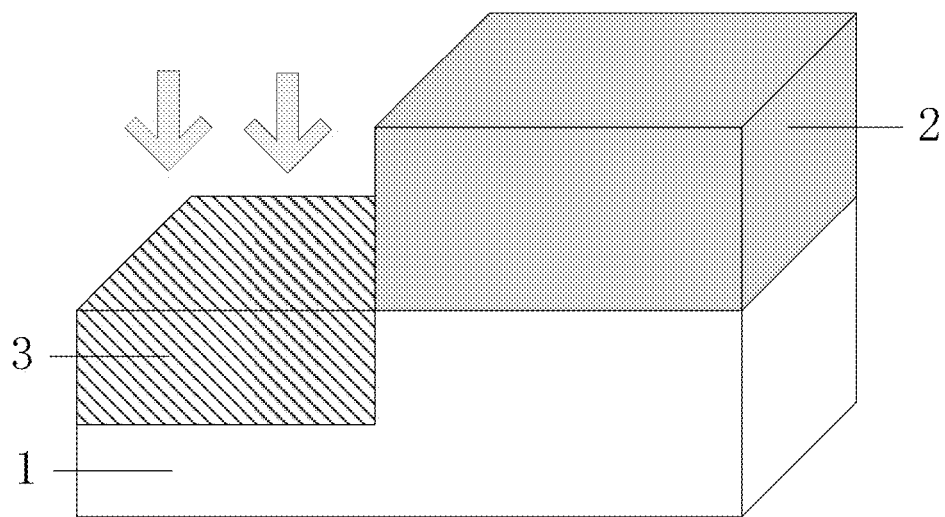
FIG. 2 is a schematic view of exposing a source region by photolithography and performing ion implantation to form a highly-doped source region.

1. As shown in FIG. 2, an active region isolation layer is fabricated on a bulk silicon wafer substrate 1 having a crystal orientation of (100) by using a shallow trench isolation technology. The substrate has a lightly-doped concentration. A source doping region is exposed by photolithography, and P+ ion implantation is performed by using a photoresist 2 as a mask to form a highly-doped source region. The energy for the ion implantation is 40 keV, and the implantation impurity is $BF_2^+$.

Figure 3:
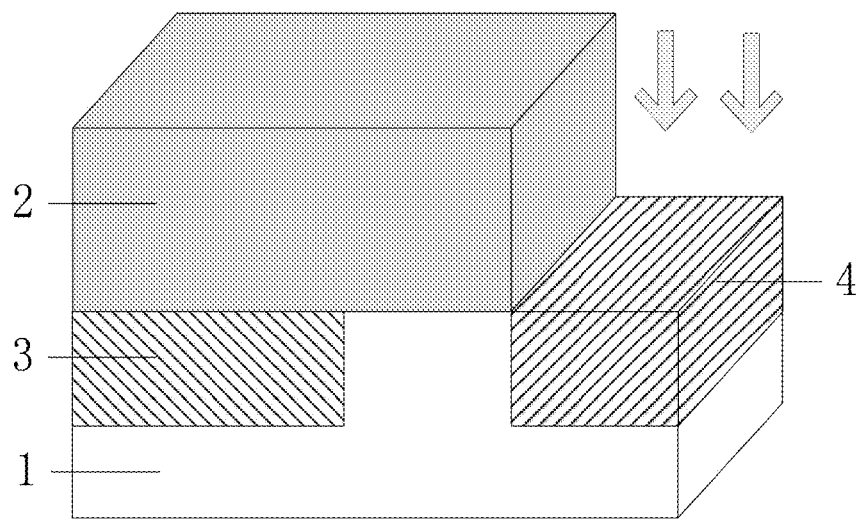
FIG. 3 is a schematic view of exposing a drain region by photolithography and performing ion implantation to form a lightly-doped drain region, which has an opposite doping type.

2. As shown in FIG. 3, a drain doping region is exposed by photolithography, and ion implantation is performed by using a photoresist 2 as a mask to form a lightly-doped N drain region 4. The energy for the ion implantation is 50 keV, and the implantation impurity is $As^+$. A rapid high temperature annealing is performed once to activate the impurities doped in the drain and source.

Figure 4:
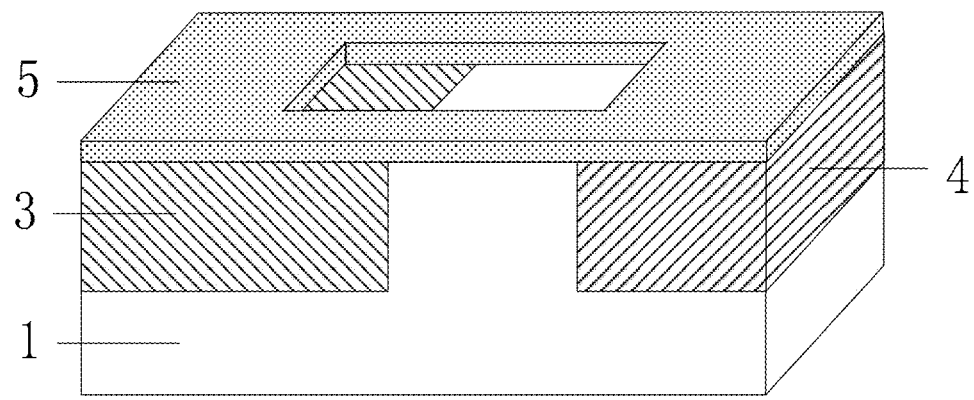
FIG. 4 is a schematic view of depositing a hard mask layer and forming a horizontal pattern where a channel region is located by performing photolithography and etching.
Figure 5:
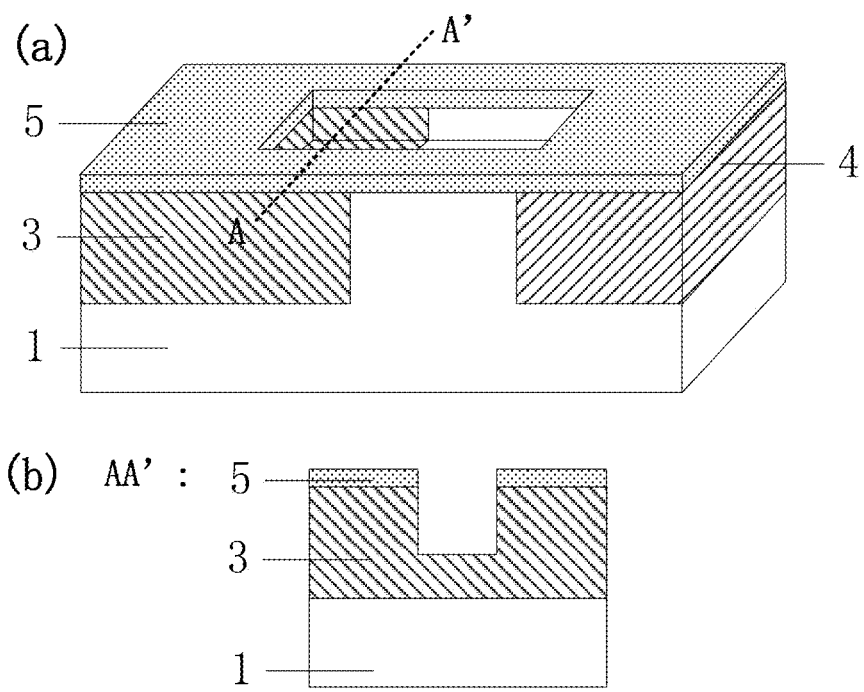

3. As shown in FIG. 4, a hard mask 5 is deposited. The hard mask may be $Si_3N_4$ and a thickness thereof is between 500 nm and 1 μm. A horizontal pattern exposing a location of a channel region is formed by photolithography. The hard mask is etched to expose a part of the highly-doped source region 3 and a part of the semiconductor substrate 1.

4. As shown in FIG. 5a and FIG. 5b, the silicon material layer is anisotropically etched under the protection of the hard mask 5. The etched thickness is consistent with a width of the channel region, which is between 25 nm and 1.5 μm.

Figure 6:
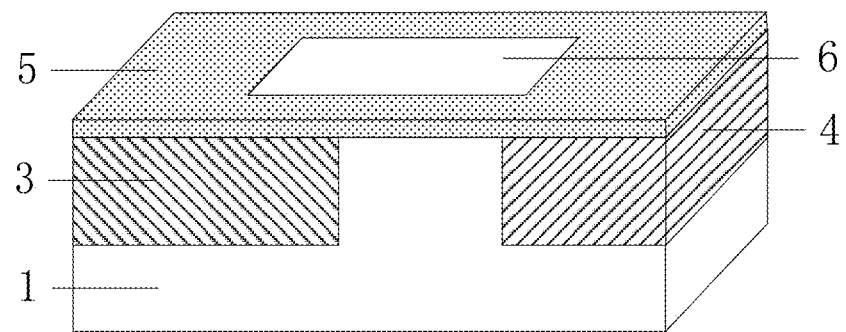
FIG. 6 is a schematic view of epitaxially growing a channel region material and performing CMP.
Figure 7:
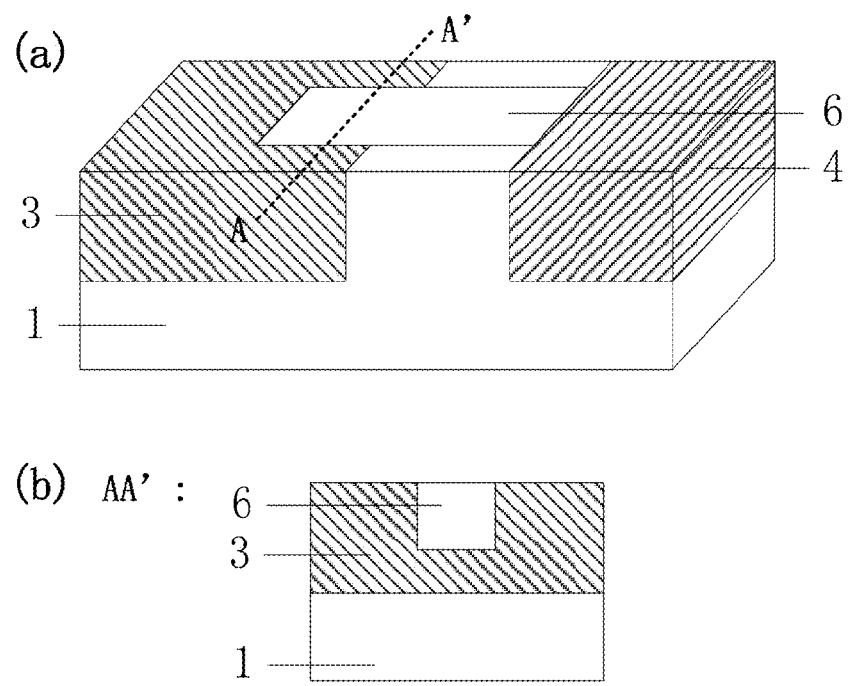

5. As shown in FIG. 6, an epitaxial silicon is formed within the window exposing the silicon substrate, under the protection of the hard mask 5. A lightly-doped channel region 6 is formed by performing chemical mechanical planarization (CMP) using the hard mask 5 as a stop layer.

6. As shown in FIG. 7a and FIG. 7b, the epitaxial silicon 6 is anisotropically etched under the protection of the hard mask 5. The etched thickness is consistent with a thickness of the hard mask layer 5, which is between 500 nm and 1 μm. The hard mask layer 5 is etched by using the wet etching method, and then thermal oxidation is performed. The $SiO_2$ formed on the surface is removed to obtain a surface with lower roughness.

Figure 8:
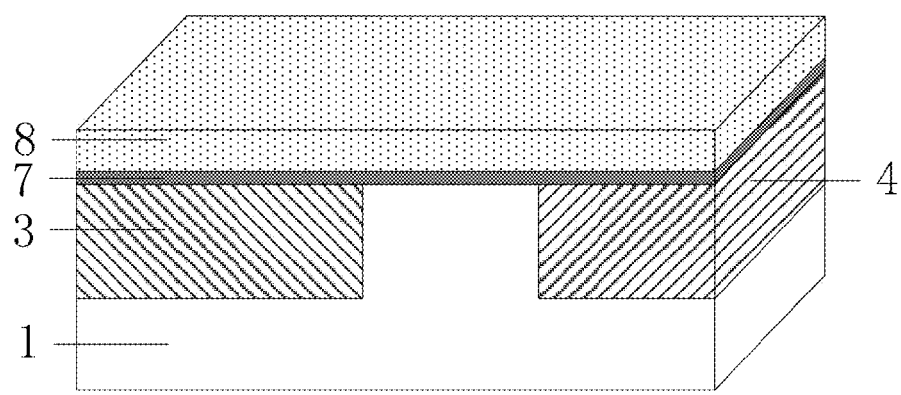
FIG. 8 is a schematic view of growing a gate dielectric layer and depositing a gate material.

7. As shown in FIG. 8, a gate dielectric layer 7 is thermally grown. The gate dielectric layer may be $SiO_2$, and a thickness thereof is between 1 nm and 5 nm. A gate material is deposited. The gate material may be doped polysilicon, and a thickness thereof is between 150 nm and 300 nm.

Figure 9:
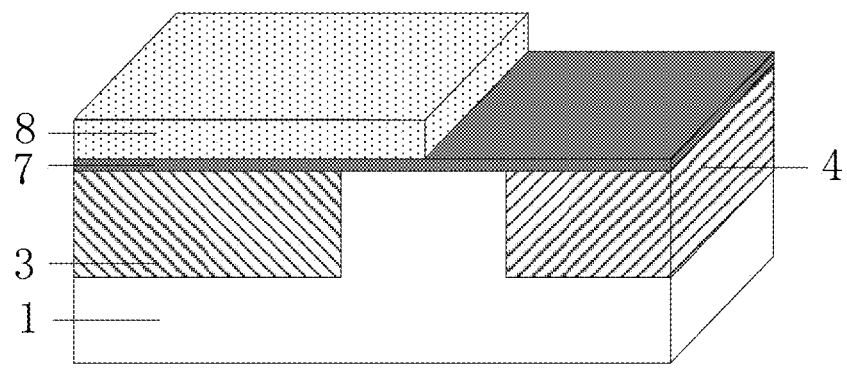
FIG. 9 is a schematic view of a tunneling field effect transistor having a three-side source according to the present invention after forming a control gate pattern by photolithography and etching.

8. As shown in FIG. 9, a pattern exposing a control gate is formed by photolithography. The gate material is etched to the gate dielectric layer 7 to form the control gate 8. The control gate 8 is spaced apart from the lightly-doped drain region 4 by an interval, which is between 10 nm and 1 μm.

Subsequently, conventional CMOS back-end processes are proceeded, which comprises depositing a passivation layer, opening a contact hole, and performing metallization. As such, a tunneling field effect transistor having a three-side source is fabricated.

Although the present invention is disclosed by the preferred embodiment, however, it is not intended to limit the present invention. Without departing from the scope of the technical solution of the present invention, a number of variations and modifications may be made possible to the technical solution of the present invention using the method and technical contents disclosed above, or equivalent embodiments may be modified. Therefore, any simple modifications, equivalent changes and modifications made to the above embodiments according to the technical spirit of the present invention without departing from the contents of the technical solution of the present invention all fall into the protection scope of the present invention.

What is claimed is:

1. A tunneling field effect transistor, comprising a semiconductor substrate (1), a channel region (6), a highly-doped source region (3), a lightly-doped drain region (4), a gate dielectric layer (7), and a control gate (8),
    wherein the channel region (6) is in a cuboid shape; when viewing from a horizontal direction, a side of the channel region (6) extends into the highly-doped source region (3), and the other side thereof is connected to the lightly-doped drain region (4); when viewing from a vertical direction, the channel region (6) is located under the control gate (8) and the gate dielectric layer (7); the channel region (6) extending into the highly-doped source region (3) is surrounded at three sides by the highly-doped source region (3), while the channel region (6) not extending into the highly-doped source region (3) is surrounded by the semiconductor substrate (1); the control gate (8) is spaced apart from the lightly-doped drain region (4) by a horizontal interval; the control gate (8) covers the highly-doped source region (3) and a part of the channel region (6); the lightly-doped drain region (4) and the highly-doped source region (3) are doped with different types of impurities; the lightly-doped drain region (4) has a doping concentration between $5\times10^{17}$ cm$^{-3}$ and $1\times10^{19}$ cm$^{-3}$, and the highly-doped source region (3) has a doping concentration between $1\times10^{19}$ cm$^{-3}$ and $1\times10^{21}$ cm$^{-3}$.

2. The tunneling field effect transistor according to claim 1, wherein both of the semiconductor substrate (1) and the channel region (6) have a doping concentration between $1\times10^{14}$ cm$^{-3}$ and $1\times10^{17}$ cm$^{-3}$.

3. The tunneling field effect transistor according to claim 1, wherein the cuboid shaped channel region (6) has equal width and height, which is less than twice width of a source depletion layer, the width of the source depletion layer having a range between 25 nm and 1.5 µm; the channel region (6) has a length greater than a width and a height, a ratio of the length to the width and height of the channel region (6) being between 1.5:1 and 5:1.

4. The tunneling field effect transistor according to claim 1, wherein the horizontal interval between the lightly-doped drain region (4) and the control gate (8) is between 10 nm and 1 µm.

5. A fabrication method of the tunneling field effect transistor according to claim 1, comprising the steps of:
    step 1: defining an active region on a semiconductor substrate by a shallow trench isolation process;
    step 2: exposing a source doping region by photolithography, and forming a highly-doped source region by performing ion implantation using a photoresist as a mask;
    step 3: exposing a drain doping region by photolithography, forming a lightly-doped drain region having a different doping type by performing ion implantation using a photoresist as a mask, and then performing annealing to activate the doped impurities;
    step 4: depositing a hard mask material, and then performing photolithography and etching on the hard mask material to form a horizontal pattern exposing a location of the channel region, the pattern incorporating a part of the highly-doped region and a part of the semiconductor substrate;
    step 5: forming a cuboid region where the channel region is located by etching under protection of the hard mask material;
    step 6: performing selective epitaxy to epitaxially grow a lightly-doped channel region under protection of the hard mask material, and performing chemical mechanical planarization using the hard mask material as a stop layer;
    step 7: etching a certain thickness of the epitaxial material under protection of the hard mask material, the thickness being consistent with a thickness of the hard mask material; removing the hard mask material by using etching; and reducing surface roughness using sacrificial oxidation or hydrogen annealing;
    step 8: growing a gate dielectric layer and depositing a control gate material; performing photolithography and etching to form a control gate pattern, the control gate being spaced apart from the lightly-doped drain region by a certain interval;
    step 9: proceeding to conventional CMOS back-end processes to fabricate the tunneling field effect transistor according to claim 1.

6. The fabrication method according to claim 5, wherein material of the semiconductor substrate in the step 1 is selected from Si, Ge, SiGe, GaAs or other binary or ternary compound semiconductor of Groups II-VI, III-V and IV-IV, or silicon on insulator or germanium on insulator.

7. The fabrication method according to claim 5, wherein material of the epitaxially grown channel region in the step 6 is selected from Si, Ge, SiGe, GaAs or other binary or ternary compound semiconductor of Groups II-VI, III-V and IV-IV.

8. The fabrication method according to claim 5, wherein material of the gate dielectric layer in the step 8 is selected from $SiO_2$, $Si_3N_4$, and high-K gate dielectric.

9. The fabrication method according to claim 5, wherein the control gate material in the step 9 is selected from doped polysilicon, metal cobalt, nickel and other metal or metal silicide.

* * * * *